(12) United States Patent
Gejo et al.

(10) Patent No.: US 11,296,076 B2
(45) Date of Patent: Apr. 5, 2022

(54) SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventors: Ryohei Gejo, Kawasaki Kanagawa (JP); Tatsunori Sakano, Shinagawa Tokyo (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 36 days.

(21) Appl. No.: 17/015,141

(22) Filed: Sep. 9, 2020

(65) Prior Publication Data

US 2021/0134791 A1 May 6, 2021

(30) Foreign Application Priority Data

Nov. 1, 2019 (JP) .............................. JP2019-199659

(51) Int. Cl.
*H01L 27/06* (2006.01)
*H01L 29/739* (2006.01)
(Continued)

(52) U.S. Cl.
CPC ........ *H01L 27/0664* (2013.01); *H01L 29/407* (2013.01); *H01L 29/7397* (2013.01); *H01L 29/8613* (2013.01)

(58) Field of Classification Search
CPC ............... H01L 27/0664; H01L 29/407; H01L 29/8613
See application file for complete search history.

(56) References Cited

U.S. PATENT DOCUMENTS 9,257,543 B2 2/2016 Takahashi
2013/0207712 A1 8/2013 Suzuki et al.
(Continued)

FOREIGN PATENT DOCUMENTS

JP 2010-11609 A 1/2010
JP 5532062 B2 6/2014
(Continued)

*Primary Examiner* — Joseph C. Nicely
(74) *Attorney, Agent, or Firm* — Finnegan, Henderson, Farabow, Garrett & Dunner L.L.P.

(57) ABSTRACT

A semiconductor device includes a first electrode on a first surface of a semiconductor part, a second electrode on a second surface opposite to the first surface, and first and second control electrodes in trenches, respectively, at a first surface side. The semiconductor part includes first to sixth layers. The second and third layers of a second conductivity type are selectively provided between the first layer of a first conductivity type and the first electrode. The third layer includes a second conductivity type impurity with a higher concentration than a concentration of a second-conductivity-type impurity in the second layer. The fourth layer of the first conductivity type is selectively provided between the second layer and the first electrode. The fifth layer of the second conductivity type and the sixth layer of the first conductivity type are selectively provided between the first layer and the second electrode.

20 Claims, 7 Drawing Sheets

(51) Int. Cl.
*H01L 29/861* (2006.01)
*H01L 29/40* (2006.01)

(56) References Cited

U.S. PATENT DOCUMENTS

| | | | |
|---|---|---|---|
| 2016/0190123 A1 | 6/2016 | Laven et al. | |
| 2016/0308524 A1 | 10/2016 | Inoue et al. | |
| 2018/0308757 A1 | 10/2018 | Kakimoto | |
| 2019/0051648 A1 | 2/2019 | Kakimoto et al. | |
| 2019/0157436 A1* | 5/2019 | Lau | H01L 29/401 |
| 2021/0091072 A1* | 3/2021 | Matsudai | H01L 29/8613 |
| 2021/0202725 A1* | 7/2021 | Akai | H01L 27/06 |
| 2021/0320195 A1* | 10/2021 | Harada | H01L 29/7397 |
| 2021/0366901 A1* | 11/2021 | Okuda | H01L 27/0738 |

FOREIGN PATENT DOCUMENTS

| | | | |
|---|---|---|---|
| JP | 2016-92163 A | 5/2016 |
| JP | 5935768 B2 | 6/2016 |
| JP | 5939281 B2 | 6/2016 |
| JP | 6080938 B2 | 2/2017 |
| JP | 6119577 B2 | 4/2017 |
| JP | 2017-120801 A | 7/2017 |
| JP | 2017-135255 A | 8/2017 |
| JP | 2017-139328 A | 8/2017 |
| JP | 6337615 B2 | 6/2018 |
| JP | 6350298 B2 | 7/2018 |

* cited by examiner

SEMICONDUCTOR DEVICE

CROSS-REFERENCE TO RELATED APPLICATIONS

This application is based upon and claims the benefit of priority from Japanese Patent Application No. 2019-199659, filed on Nov. 1, 2019; the entire contents of which are incorporated herein by reference.

FIELD

Embodiments relate to a semiconductor device.

BACKGROUND

A reverse-conducting IGBT (Insulated Gate Bipolar Transistor) in which an IGBT and a diode are included in one chip is being put into practical use. However, in the reverse-conducting IGBT, it is difficult to improve the diode characteristics without affecting the characteristics of the IGBT.

DETAILED DESCRIPTION

Figure 1:
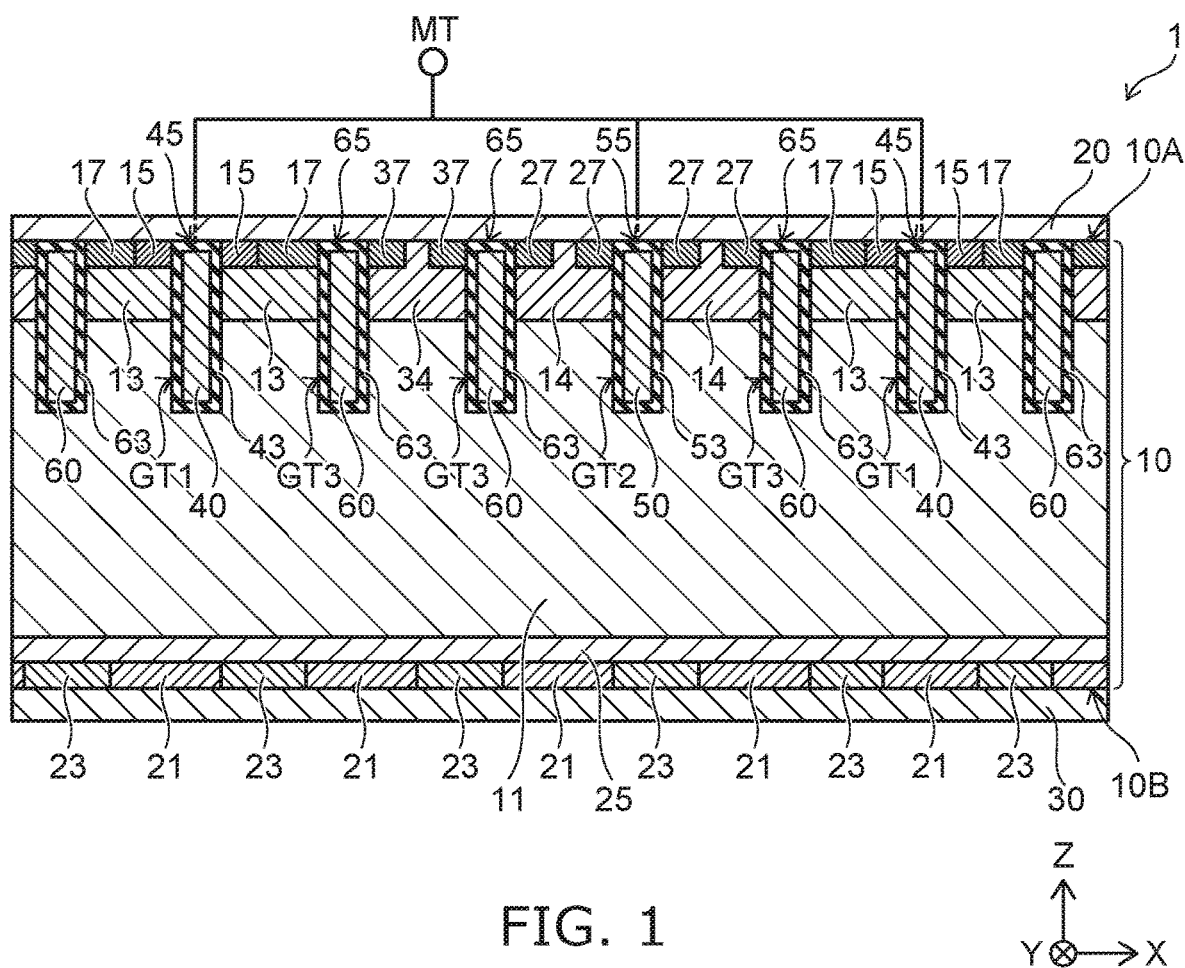
FIG. 1 is a schematic cross-sectional view showing a semiconductor device according to an embodiment.

According to one embodiment, a semiconductor device includes a semiconductor part including a first surface and a second surface, the second surface being at a side opposite to the first surface; a first electrode provided on the first surface of the semiconductor part; a second electrode provided on the second surface of the semiconductor part; a first control electrode provided between the semiconductor part and the first electrode, the first control electrode being positioned in a first trench provided at the first surface side of the semiconductor part, the first control electrode being electrically insulated from the semiconductor part by a first insulating film; a second control electrode provided between the semiconductor part and the first electrode, the second control electrode being positioned in a second trench provided at the first surface side of the semiconductor part, the second control electrode being electrically insulated from the semiconductor part by a second insulating film; and a third control electrode provided between the semiconductor part and the first electrode, the third control electrode being positioned in a third trench provided at the first surface side of the semiconductor part, the third control electrode being electrically insulated from the semiconductor part by a third insulating film and electrically isolated from the first and second control electrodes. The semiconductor part includes a first semiconductor layer of a first conductivity type, a second semiconductor layer of a second conductivity type, a third semiconductor layer of the second conductivity type, a fourth semiconductor layer of the first conductivity type, a fifth semiconductor layer of the second conductivity type, and a sixth semiconductor layer of the first conductivity type. The second semiconductor layer is selectively provided between the first semiconductor layer and the first electrode, the second semiconductor layer including a portion facing the first control electrode via the first insulating film. The third semiconductor layer is selectively provided between the first semiconductor layer and the first electrode, the third semiconductor layer including a second-conductivity-type impurity with a higher concentration than a concentration of a second-conductivity-type impurity in the second semiconductor layer, the third semiconductor layer including a portion facing the second control electrode via the second insulating film, the third semiconductor layer including a portion facing the third control electrode via the third insulating film. The fourth semiconductor layer being selectively provided between the second semiconductor layer and the first electrode, the fourth semiconductor layer contacting the first insulating film. The fifth semiconductor layer is selectively provided between the first semiconductor layer and the second electrode. The sixth semiconductor layer is selectively provided between the first semiconductor layer and the second electrode, the sixth semiconductor layer including a first-conductivity-type impurity with a higher concentration than a concentration of a first-conductivity-type impurity in the first semiconductor layer. The fifth semiconductor layer and the sixth semiconductor layer are alternately arranged along the second electrode. The first electrode is electrically insulated from the first control electrode by a fourth insulating film, and electrically insulated from the second control electrode by a fifth insulating film, the first electrode being electrically connected to the second, third, and fourth semiconductor layers. The second electrode is electrically connected to the fifth and sixth semiconductor layers.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

FIG. 1 is a schematic cross-sectional view showing a semiconductor device 1 according to an embodiment. The semiconductor device 1 is, for example, a reverse-conducting IGBT (RC-IGBT).

The semiconductor device 1 includes a semiconductor part 10, a first electrode 20, and a second electrode 30. The semiconductor part 10 is, for example, silicon. The first electrode 20 is, for example, an emitter electrode. The first electrode 20 is provided on a first surface 10A of the semiconductor part 10. The first electrode 20 is, for example, a metal layer including aluminum (Al). The second electrode 30 is, for example, a collector electrode. The second electrode 30 is provided on a second surface 10B of the semiconductor part 10. The second surface 10B is, for example, the back surface of the semiconductor part 10 and is positioned at the side opposite to the first surface 10A. The second electrode 30 is, for example, a metal layer including titanium (Ti) or aluminum (Al).

The semiconductor device 1 further includes a first control electrode 40, a second control electrode 50, and a third control electrode 60. The first control electrode 40, the second control electrode 50, and the third control electrode 60 are provided between the semiconductor part 10 and the first electrode 20. The first control electrode 40, the second control electrode 50, and the third control electrode 60 are, for example, conductive polysilicon.

The first control electrode 40 is disposed inside a trench GT1 provided at the first surface 10A side of the semiconductor part 10. The first control electrode 40 is electrically insulated from the semiconductor part 10 by a first insulating film 43. The first insulating film 43 is, for example, a silicon oxide film.

The second control electrode 50 is disposed inside a trench GT2 provided at the first surface 10A side of the semiconductor part 10. The second control electrode 50 is electrically insulated from the semiconductor part 10 by a second insulating film 53. The second insulating film 53 is, for example, a silicon oxide film.

The third control electrode 60 is disposed inside a trench GT3 provided at the first surface 10A side of the semiconductor part 10. The third control electrode 60 is electrically insulated from the semiconductor part 10 by a third insulating film 63. The third insulating film 63 is, for example, a silicon oxide film.

The semiconductor part 10 includes a first-conductivity-type (hereinbelow, n-type) first semiconductor layer 11, a second-conductivity-type (hereinbelow, p-type) second semiconductor layer 13, a p-type third semiconductor layer 14, an n-type fourth semiconductor layer 15, a p-type fifth semiconductor layer 21, and an n-type sixth semiconductor layer 23.

The first semiconductor layer 11 is, for example, an n-type base layer. For example, the first semiconductor layer 11 includes an n-type impurity with a low concentration ($1 \times 10^{13}$ to $1 \times 10^{15}$ cm$^{-3}$).

The second semiconductor layer 13 is, for example, a p-type base layer. The second semiconductor layer 13 is selectively provided between the first semiconductor layer 11 and the first electrode 20. The second semiconductor layer 13 includes, for example, a p-type impurity with a concentration range of $1 \times 10^{17}$ to $1 \times 10^{18}$ cm$^{-3}$. The second semiconductor layer 13 includes a portion facing the first control electrode 40 via the first insulating film 43. It is more desirable for the p-type impurity concentration of the second semiconductor layer 13 to be in the range of $1 \times 10^{17}$ to $5 \times 10^{17}$ cm$^{-3}$.

The third semiconductor layer 14 is, for example, a p-type anode layer. The third semiconductor layer 14 is selectively provided between the first semiconductor layer 11 and the first electrode 20. The third semiconductor layer 14 includes a p-type impurity with a higher concentration than the p-type impurity of the second semiconductor layer 13. The third semiconductor layer 14 includes, for example, a p-type impurity with a concentration range of $3 \times 10^{17}$ to $5 \times 10^{18}$ cm$^{-3}$. It is more desirable for the p-type impurity concentration of the third semiconductor layer 14 to be in the range of $5 \times 10^{17}$ to $1 \times 10^{18}$ cm$^{-3}$. From the perspective of controlling the hole injection into the first semiconductor layer 11, it is desirable for the p-type impurity concentration of the third semiconductor layer 14 to be not less than 2 times and not more than 5 times the p-type impurity concentration of the second semiconductor layer 13. The third semiconductor layer 14 includes a portion facing the second control electrode 50 via the second insulating film 53.

The fourth semiconductor layer 15 is, for example, an n-type emitter layer. The fourth semiconductor layer 15 is selectively provided between the second semiconductor layer 13 and the first electrode 20. The fourth semiconductor layer 15 is disposed at a position contacting the first insulating film 43. The fourth semiconductor layer 15 includes an n-type impurity with a higher concentration than the n-type impurity of the first semiconductor layer 11. For example, the first electrode 20 is in contact with and electrically connected to the fourth semiconductor layer 15.

The fifth semiconductor layer 21 is, for example, a p-type collector layer. The fifth semiconductor layer 21 is selectively provided between the first semiconductor layer 11 and the second electrode 30. The fifth semiconductor layer 21 includes, for example, a p-type impurity with the same concentration level as the p-type impurity of the second semiconductor layer 13. The fifth semiconductor layer 21 includes, for example, a p-type impurity with a concentration range of $1 \times 10^{17}$ to $5 \times 10^{17}$ cm$^{-3}$.

The sixth semiconductor layer 23 is, for example, an n-type cathode layer. The sixth semiconductor layer 23 is selectively provided between the first semiconductor layer 11 and the second electrode 30. The sixth semiconductor layer 23 includes an n-type impurity with a higher concentration than the n-type impurity of the first semiconductor layer 11.

The fifth semiconductor layer 21 and the sixth semiconductor layer 23 are provided on the second electrode 30 and alternately arranged along the second electrode 30. The second electrode 30 is electrically connected to the fifth and sixth semiconductor layers 21 and 23. The second electrode 30 also is electrically connected to the first semiconductor layer 11 via the sixth semiconductor layer 23.

The semiconductor part 10 further includes a seventh semiconductor layer 17, an eighth semiconductor layer 25, a ninth semiconductor layer 27, a tenth semiconductor layer 34, and an eleventh semiconductor layer 37.

The seventh semiconductor layer 17 is, for example, a p-type emitter layer. The seventh semiconductor layer 17 is selectively provided between the second semiconductor layer 13 and the first electrode 20. The seventh semiconductor layer 17 includes a p-type impurity with a higher concentration than the p-type impurity of the second semiconductor layer 13. Also, the seventh semiconductor layer 17 includes a p-type impurity with a higher concentration than the p-type impurity of the third semiconductor layer 14.

The seventh semiconductor layer 17 is arranged along the first electrode 20 with the fourth semiconductor layer 15. For example, the first electrode 20 is in contact with and electrically connected to the seventh semiconductor layer 17. The first electrode 20 is electrically connected to the second semiconductor layer 13 via the seventh semiconductor layer 17.

The eighth semiconductor layer 25 is, for example, an n-type buffer layer. The eighth semiconductor layer 25 is provided between the first semiconductor layer 11 and the fifth semiconductor layer 21. The eighth semiconductor layer 25 includes an n-type impurity with a higher concentration than the n-type impurity of the first semiconductor layer 11.

The ninth semiconductor layer 27 is, for example, a p-type contact layer. The ninth semiconductor layer 27 is selectively provided between the third semiconductor layer 14 and the first electrode 20. The ninth semiconductor layer 27 includes a p-type impurity with a higher concentration than the p-type impurity of the third semiconductor layer 14. For example, the first electrode 20 is in contact with and electrically connected to the ninth semiconductor layer 27. The first electrode 20 is electrically connected to the third semiconductor layer 14 via the ninth semiconductor layer 27.

The tenth semiconductor layer 34 is, for example, a p-type anode layer. The tenth semiconductor layer 34 is selectively provided between the first semiconductor layer 11 and the first electrode 20. The tenth semiconductor layer 34 is positioned between two adjacent third control electrodes 60 and includes portions respectively facing the third control electrodes 60 via the third insulating films 63. The tenth semiconductor layer 34 includes a p-type impurity with a higher concentration than the p-type impurity of the second semiconductor layer 13. For example, the tenth semiconductor layer 34 includes the p-type impurity with the same concentration level as the p-type impurity of the third semiconductor layer 14.

The eleventh semiconductor layer 37 is, for example, a p-type contact layer. The eleventh semiconductor layer 37 is selectively provided between the tenth semiconductor layer 34 and the first electrode 20. The eleventh semiconductor layer 37 includes a p-type impurity with a higher concentration than the p-type impurity of the tenth semiconductor layer 34. For example, the first electrode 20 is in contact with and electrically connected to the eleventh semiconductor layer 37. The first electrode 20 is electrically connected to the tenth semiconductor layer 34 via the eleventh semiconductor layer 37.

The first control electrode 40 is electrically insulated from the first electrode 20 by a fourth insulating film 45. The fourth insulating film 45 is, for example, a silicon oxide film. For example, the first control electrode 40 is electrically connected to a first control terminal MT.

The second control electrode 50 is electrically insulated from the first electrode 20 by a fifth insulating film 55. The fifth insulating film 55 is, for example, a silicon oxide film. For example, the second control electrode 50 is electrically connected to the first control terminal MT. The same control voltage as that of the first control electrode 40 is applied to the second control electrode 50.

For example, the third control electrode 60 is electrically connected to the first electrode 20. For example, a sixth insulating film 65 is provided between the first electrode 20 and the third control electrode 60. The sixth insulating film 65 is, for example, a silicon oxide film. The first electrode 20 is electrically connected to the third control electrode 60 via a contact portion that extends through the sixth insulating film 65 and reaches the third control electrode 60 (referring to FIG. 6). The third control electrode 60 is electrically isolated (insulated) from the first and second control electrodes 40 and 50 and is independently biased. The embodiment is not limited to the example; for example, a configuration may be used in which the first electrode 20 is directly connected to the third control electrode 60 without disposing the sixth insulating film 65.

Multiple first control electrodes 40 are provided, and the second control electrode 50 and the third control electrode 60 are disposed between adjacent first control electrodes 40. The second control electrode 50 and the third control electrode 60 are appropriately arranged to reduce the conduction loss and the switching loss in the IGBT mode and the diode mode. To this end, the arrangement does not always have adjacent third control electrodes 60 between which the second control electrode 50 is not interposed. In other words, there are also cases where the tenth semiconductor layer 34 and the eleventh semiconductor layer 37 are not provided.

Figure 2A:
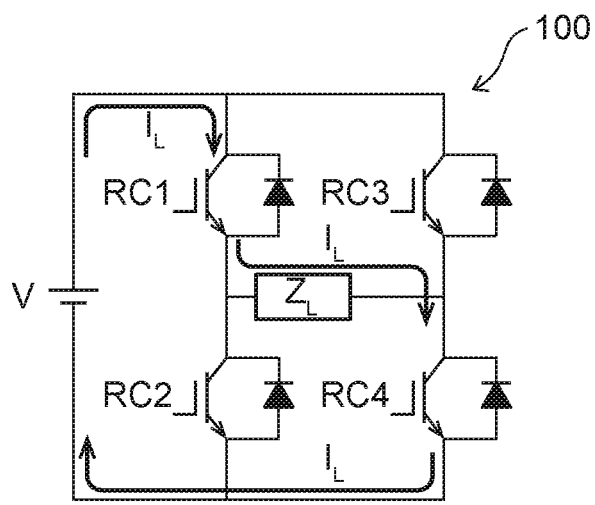
FIGS. 2A and 2B are circuit diagrams showing a power conversion circuit using the semiconductor device according to the embodiment.
Figure 2B:
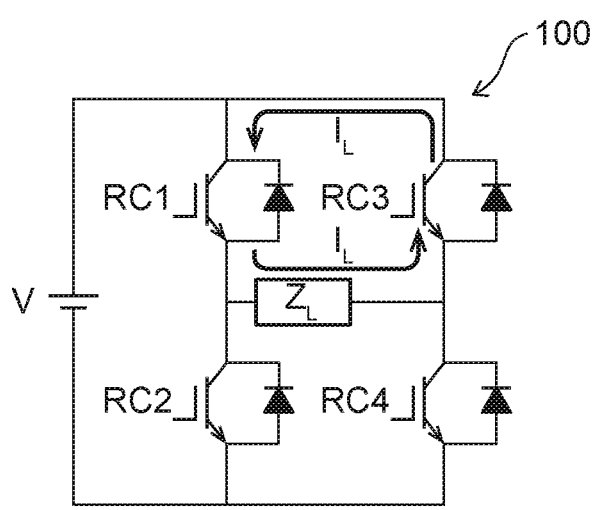

FIGS. 2A and 2B are circuit diagrams showing a power conversion circuit 100 using the semiconductor device 1 according to the embodiment. FIGS. 2A and 2B are circuit diagrams illustrating a single-phase inverter circuit including four semiconductor devices 1 (hereinbelow, semiconductor devices RC1 to RC4).

As shown in FIGS. 2A and 2B, the semiconductor devices RC1 and RC3 are arranged in parallel in arms at the high potential side, and the semiconductor devices RC2 and RC4 are arranged in parallel in arms at the low potential side. The switching control of the semiconductor devices RC1 to RC4 is performed to cause an AC current of a prescribed frequency to flow in a load $Z_L$. The load $Z_L$ is, for example, an inductor.

FIGS. 2A and 2B show processes of the waveform control of a current $I_L$ flowing in the load $Z_L$. For example, the controls shown in FIGS. 2A and 2B are alternately performed so that the waveform of the current $I_L$ flowing in the load $Z_L$ approaches a sine wave.

In the process shown in FIG. 2A, the semiconductor devices RC1 to RC4 operate in the IGBT mode, the semiconductor devices RC1 and RC4 are in the on-state, and the semiconductor devices RC2 and RC3 are in the off-state. The current $I_L$ is supplied from a power supply V to the load $Z_L$. At this time, the current $I_L$ flows through a path via the semiconductor devices RC1 and RC4.

In the process shown in FIG. 2B, the semiconductor device RC4 is turned off, and the semiconductor device RC1 is maintained in the on-state. The semiconductor device RC2 is maintained in the off-state. Thereby, the supply of the current $I_L$ from the power supply V is stopped, but the current $I_L$ continues to flow while gradually decreasing due to the electrical energy stored in the load $Z_L$. At this time, the current $I_L$ flows through a path via the semiconductor devices RC3 and RC1. The p-n junction between the first semiconductor layer 11 and the second semiconductor layer 13 in the semiconductor device RC3 (referring to FIG. 1) is biased in the forward direction by an electromotive force generated in the load $Z_L$. In other words, the semiconductor device RC3 forms a path of the current $I_L$ by operating in the diode mode.

Continuing, the semiconductor device RC4 is again turned on. Thereby, the process returns to the process shown in FIG. 2A, and the current $I_L$ is supplied from the power supply V to the load $Z_L$ by the path via the semiconductor devices RC1 and RC4. The semiconductor device RC2 is maintained in the off-state. The semiconductor device RC3 transitions from the diode mode to the IGBT mode and is switched to the off-state.

Subsequently, the semiconductor device RC4 is again turned off, and the process returns to the process shown in FIG. 2B. Thus, by switching the semiconductor device RC4 on and off, the processes shown in FIGS. 2A and 2B are alternately repeated, and the waveform of the current $I_L$ is controlled.

To control a load current flowing in the reverse direction of the current $I_L$ shown in FIGS. 2A and 2B, the semiconductor device RC3 is repeatedly switched on and off in a state in which the semiconductor device RC1 is set to the off-state and the semiconductor device RC2 is turned on. Accordingly, the semiconductor device RC4 alternately repeats the operations of the IGBT mode and the diode mode.

Figure 3:
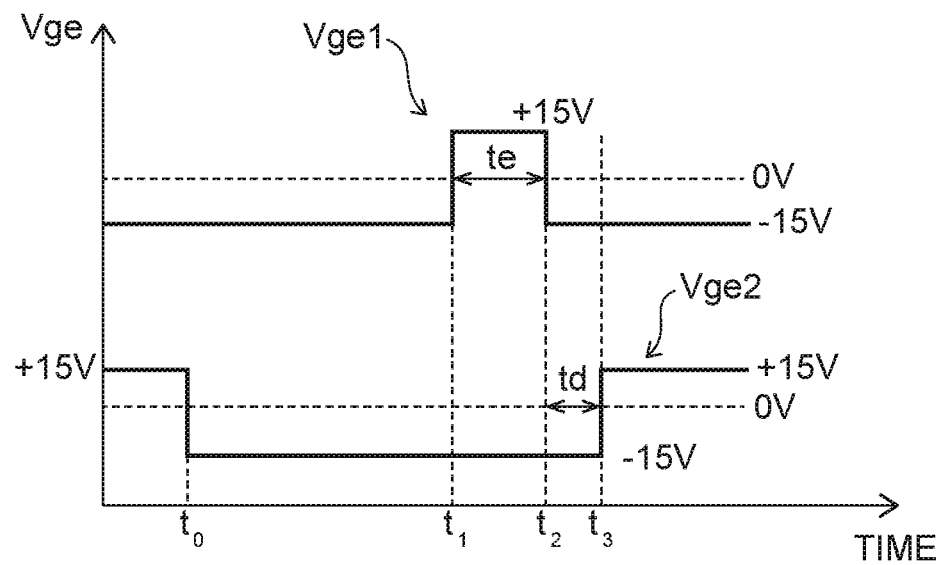
FIG. 3 is a timing chart showing a method for controlling the power conversion circuit shown in FIGS. 2A and 2B.

FIG. 3 is a timing chart showing a method for controlling the power conversion circuit 100. A control voltage Vge shown in FIG. 3 is applied to the first and second control electrodes 40 and 50 via the first control terminal MT for each of the semiconductor devices RC1 to RC4.

Control voltages Vge1 and Vge2 shown in FIG. 3 are applied respectively to the semiconductor devices RC3 and RC4 in the control processes shown in FIGS. 2A and 2B. The control voltage Vge1 is applied to the semiconductor device RC3, and the control voltage Vge2 is applied to the semiconductor device RC4.

As shown in FIG. 3, the control voltage Vge2 that is applied to the semiconductor device RC4 is maintained at, for example, positive 15 V until a time $t_0$ and is switched to, for example, negative 15 V at the time $t_0$. Subsequently, the control voltage Vge2 is maintained at negative 15 V until a time $t_3$ and is switched to, for example, positive 15 V at the time $t_3$.

The threshold voltages of the first and second control electrodes 40 and 50 are, for example, positive 15 V or less. Accordingly, the semiconductor device RC4 is turned off at the time $t_0$ and turned on at the time $t_3$.

On the other hand, the control voltage Vge1 that is applied to the semiconductor device RC3 is, for example, negative 15 V until a time $t_1$ and is switched to, for example, positive 15 V at the time $t_1$. Continuing, the control voltage Vge1 is returned to negative 15 V at a time $t_2$, which is before the time $t_3$.

The semiconductor device RC3 repeats the operation of the IGBT mode and the operation of the diode mode corresponding to switching the semiconductor device RC4 on and off (referring to FIGS. 2A and 2B). In other words, the semiconductor device RC3 operates in the diode mode between the time $t_0$ and the time $t_3$.

Figure 4A:
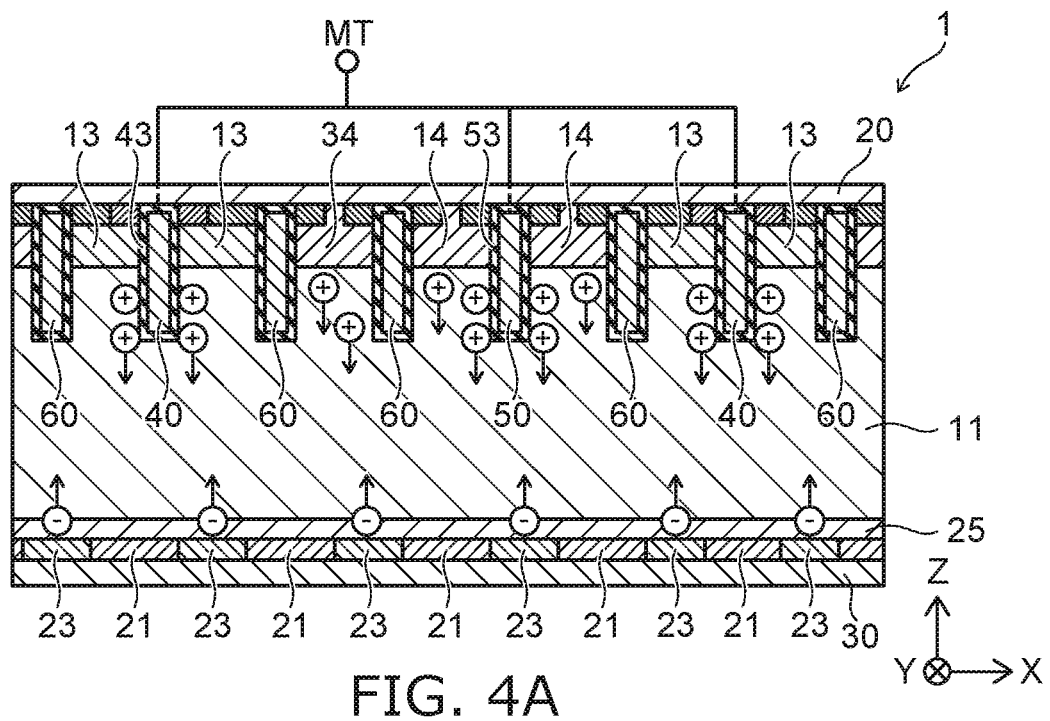
FIGS. 4A and 4B are schematic plan views showing operations of the semiconductor device according to the embodiment.
Figure 4B:
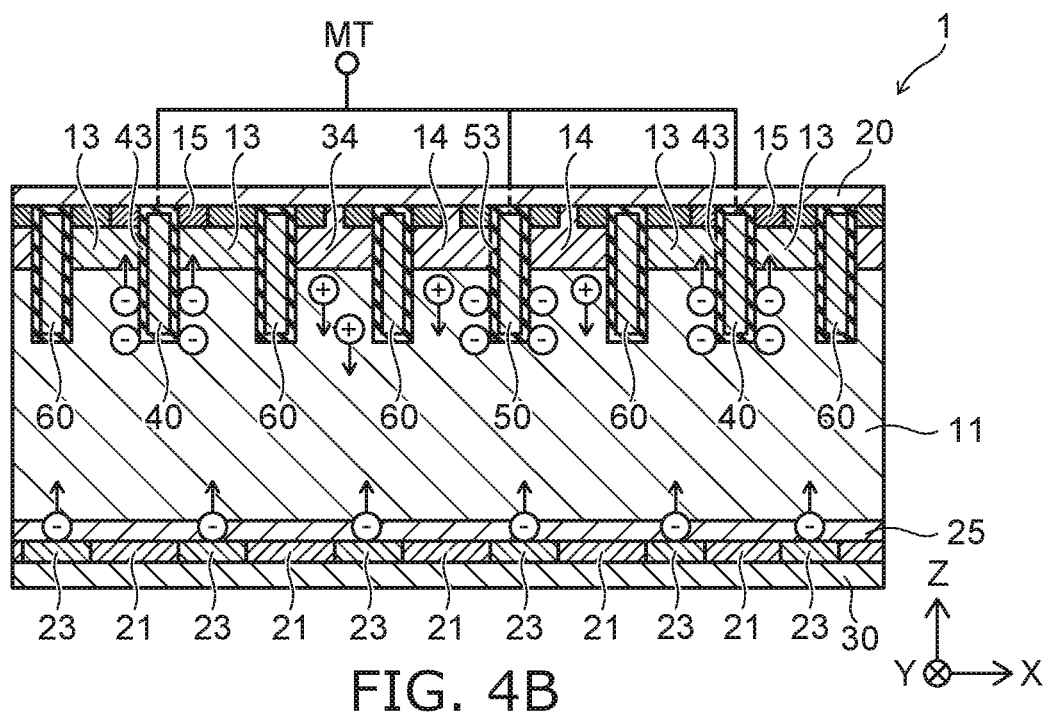

FIGS. 4A and 4B are schematic plan views showing operations of the semiconductor device 1 according to the embodiment. FIGS. 4A and 4B correspond to the operation of the semiconductor device RC3 in the control process shown in FIG. 2B. Namely, the movement of the carriers in the diode mode of the semiconductor device 1 is shown.

In the diode mode of the semiconductor device 1, the p-n junctions between the first semiconductor layer 11 and the second semiconductor layer 13, between the first semiconductor layer 11 and the third semiconductor layer 14, and between the first semiconductor layer 11 and the tenth semiconductor layer 34 are forward-biased, and holes are injected into the first semiconductor layer 11 from the second semiconductor layer 13, the third semiconductor layer 14, and the tenth semiconductor layer 34. Accordingly, electrons are injected from the sixth semiconductor layer 23 into the first semiconductor layer 11.

In the semiconductor device 1, the third and tenth semiconductor layers 14 and 34 include the p-type impurity with a higher concentration than the p-type impurity of the second semiconductor layer 13. Therefore, more holes are injected into the first semiconductor layer 11 from the third and tenth semiconductor layers 14 and 34. Accordingly, compared to when the p-type impurity concentrations of the third and tenth semiconductor layers 14 and 34 are the same concentration level as the p-type impurity concentration of the second semiconductor layer 13, the densities of the holes and electrons in the first semiconductor layer 11 are increased, and the conduction loss can be reduced.

Also, in the control method according to the embodiment, the control voltage Vge1 of negative 15 V is applied to the first and second control electrodes 40 and 50 (referring to FIG. 3).

As shown in FIG. 4A, an accumulation layer of holes is formed at the interface between the first semiconductor layer 11 and the first insulating film 43. Holes accumulate also at the interface between the first semiconductor layer 11 and the second insulating film 53. Therefore, the injection of holes from the second and third semiconductor layers 13 and 14 into the first semiconductor layer 11 is promoted, and the densities of the holes and electrons in the first semiconductor layer 11 can be increased further. In other words, it is possible to further reduce the conduction loss in the diode mode of the semiconductor device 1.

Also, the control voltage Vge1 of positive 15 V is applied to the first and second control electrodes 40 and 50 directly before turning on the semiconductor device RC4 (referring to FIG. 3). Thereby, an n-type inversion layer (not illustrated) is induced at the interface between the second semiconductor layer 13 and the first insulating film 43.

As shown in FIG. 4B, an ejection path of electrons from the first semiconductor layer 11 to the first electrode 20 via the n-type inversion layer and the fourth semiconductor layer 15 is formed at the vicinity of the first control electrode 40. The densities of the holes and electrons in the first semiconductor layer 11 can be reduced thereby. Also, an accumulation layer of electrons is formed at the interface between the first semiconductor layer 11 and the second insulating film 53 at the vicinity of the second control electrode 50. Therefore, the injection path of the holes between the second control electrode 50 and the third control electrode 60 becomes narrow, and the hole injection from the third semiconductor layer 14 into the first semiconductor layer 11 is suppressed.

Thus, in the semiconductor device 1, the conduction loss can be reduced by increasing the densities of the holes and electrons in the first semiconductor layer 11. Also, by appropriately controlling the first control electrode 40 and the second control electrode 50, the switching loss in the diode mode can be reduced by reducing the densities of the holes and electrons in the first semiconductor layer 11.

In the power conversion circuit 100, the densities of the holes and electrons in the first semiconductor layer 11 of the semiconductor device RC3 can be reduced directly before turning on the semiconductor device RC4 (referring to FIG. 3). The time to deplete the first semiconductor layer 11 of the semiconductor device RC3 after turning on the semiconductor device RC4 can be reduced thereby.

If the densities of the holes and electrons in the first semiconductor layer 11 of the semiconductor device RC3 are excessively reduced, the forward resistance becomes large, and the conduction loss increases. There are also cases where an excessive forward voltage is applied to the semiconductor device RC3 and breakdown of the element occurs. Therefore, for example, the densities of the holes and electrons in the first semiconductor layer 11 are appropriately controlled by a time $t_0$ of applying the control voltage Vge1 of positive 15 V (referring to FIG. 3).

A time td from returning the control voltage Vge1 to the negative voltage at the time $t_2$ until the semiconductor device RC4 is turned on (referring to FIG. 3) is set, for example, to avoid simultaneously setting the semiconductor device RC3 and the semiconductor device RC4 to the on-state. For example, if the time td is increased, there is a possibility that the densities of the holes and electrons in the first semiconductor layer 11 may return to the original state even when reduced between the times $t_1$ to $t_2$ (referring to FIG. 3). Accordingly, it is favorable for the time td to be short. For example, the time td is set to be less than the time te.

Figure 5:
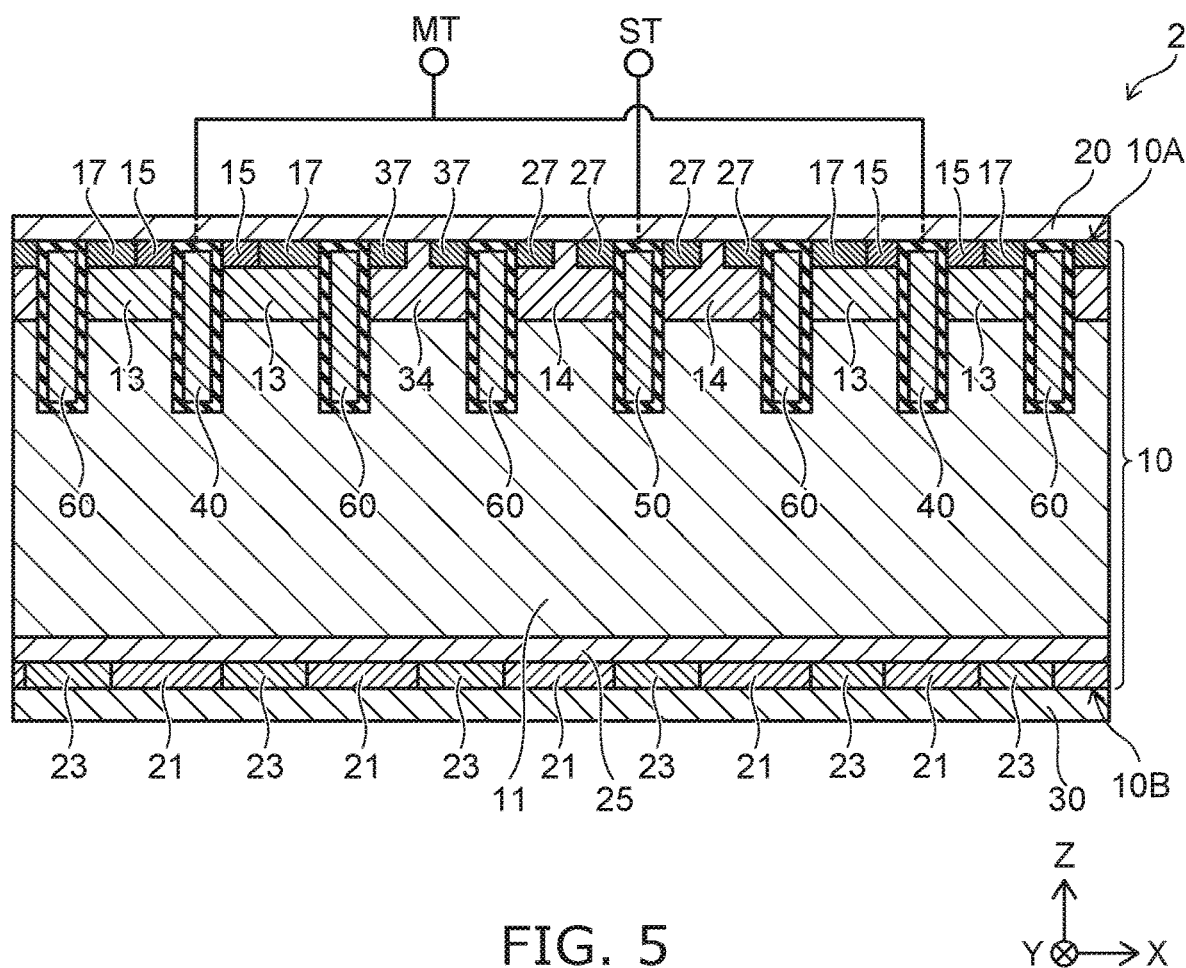
FIG. 5 is a schematic cross-sectional view showing a semiconductor device according to a first modification of the embodiment.

FIG. 5 is a schematic cross-sectional view showing a semiconductor device 2 according to a first modification of the embodiment. The semiconductor device 2 is, for example, an RC-IGBT and includes the first control electrode 40, the second control electrode 50, and the third control electrode 60.

In the semiconductor device 2 as shown in FIG. 5, the first control electrode 40 is electrically connected to the first control terminal MT, and the second control electrode 50 is electrically connected to a second control terminal ST. The third control electrode 60 is electrically connected to the first electrode 20.

In the semiconductor device 2, the potential of the second control electrode 50 can be controlled independently of the first control electrode 40. Thereby, it is possible to independently control the hole injection from the third semiconductor layer 14 into the first semiconductor layer 11, and the controllability of the densities of the holes and electrons in the first semiconductor layer 11 can be improved.

Figure 6:
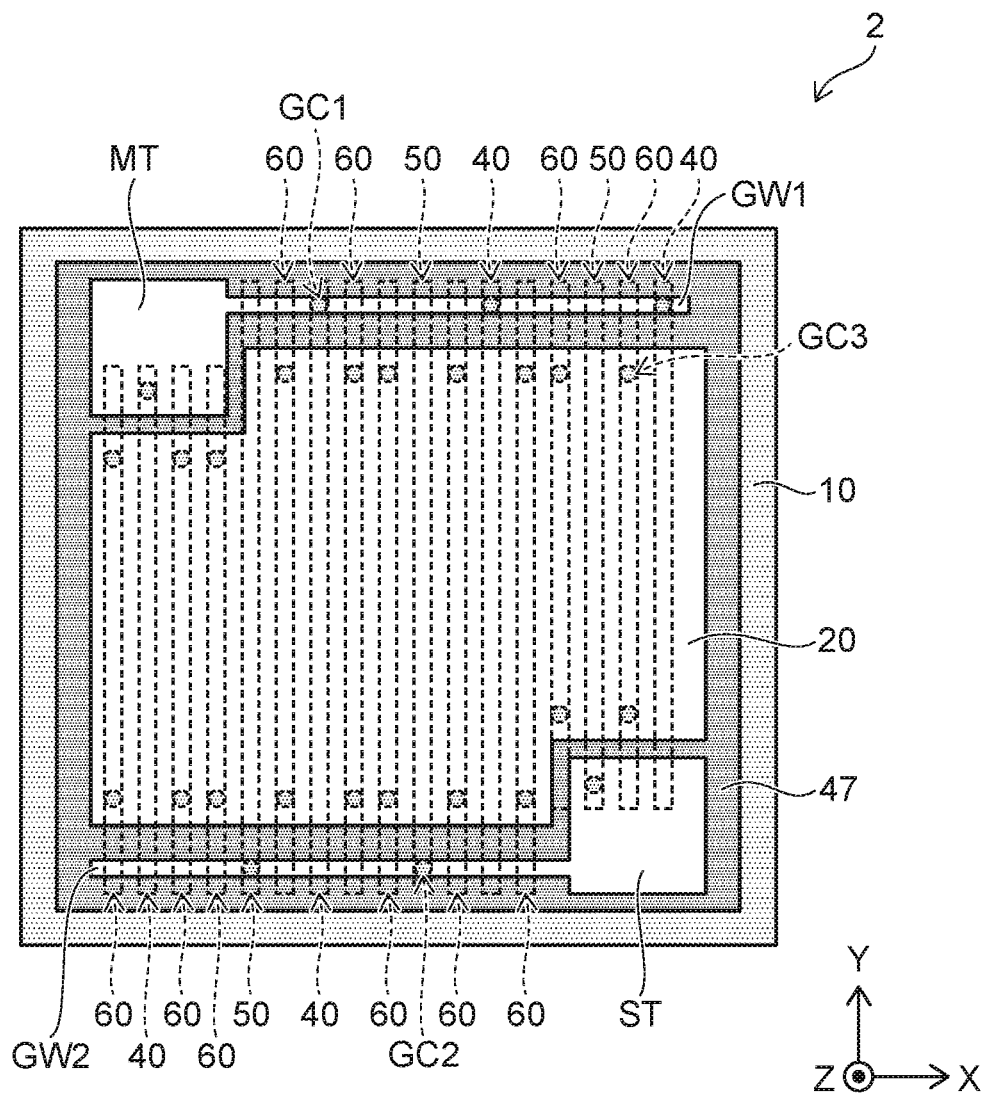
FIG. 6 is a schematic plan view showing the semiconductor device according to the first modification of the embodiment.

FIG. 6 is a schematic plan view showing the semiconductor device 2 according to the first modification of the embodiment. FIG. 6 is a schematic view showing the arrangement of the first electrode 20, the first control terminal MT, and the second control terminal ST.

The first control terminal MT and the second control terminal ST are, for example, gate pads. For example, the first control terminal MT and the second control terminal ST are electrically insulated from the semiconductor part 10 by a seventh insulating film 47. The seventh insulating film 47 is, for example, a silicon oxide film.

As shown in FIG. 6, the semiconductor device 2 further includes a first control interconnect GW1 and a second control interconnect GW2. The first control interconnect GW1 is connected to the first control terminal MT and extends in, for example, the X-direction. The second control interconnect GW2 is connected to the second control terminal ST and extends in, for example, the X-direction. For example, the first control interconnect GW1 and the second control interconnect GW2 are electrically insulated from the semiconductor part 10 by the seventh insulating film 47.

The first control terminal MT and the first control interconnect GW1 are separated from the first electrode 20, the second control terminal ST, and the second control interconnect GW2. The second control terminal ST and the second control interconnect GW2 are separated from the first electrode 20. For example, the first electrode 20 is disposed between the first control terminal MT and the second control terminal ST and between the first control interconnect GW1 and the second control interconnect GW2.

As shown by the broken lines in FIG. 6, for example, the first control electrode 40, the second control electrode 50, and the third control electrode 60 extend in the Y-direction below the first electrode 20. The first control electrode 40 is provided to cross the first control terminal MT or the first control interconnect GW1. The second control electrode 50 is provided to cross the second control terminal ST or the second control interconnect GW2.

For example, the first control electrode 40 is electrically connected to the first control terminal MT or the first control interconnect GW1 via a first contact portion GC1. The first contact portion GC1 is provided at a portion where the first control electrode 40 crosses the first control terminal MT or the first control interconnect GW1. The first contact portion GC1 extends through the insulating film 47 from the first control terminal MT or the first control interconnect GW1 and is connected to the first control electrode 40. The first contact portion GC1 is, for example, a portion of the first control terminal MT or the first control interconnect GW1 extending through a contact hole provided in the seventh insulating film 47.

For example, the second control electrode 50 is electrically connected to the second control terminal ST or the second control interconnect GW2 via a second contact portion GC2. The second contact portion GC2 is provided at a portion where the second control electrode 50 crosses the second control terminal ST or the second control interconnect GW2. The second contact portion GC2 extends through the insulating film 47 from the second control terminal ST or the second control interconnect GW2 and is connected to the second control electrode 50. The second contact portion GC2 is, for example, a portion of the second control terminal ST or the second control interconnect GW2 extending through a contact hole provided in the seventh insulating film 47.

For example, the third control electrode 60 is electrically connected to the first electrode 20 via a third contact portion GC3. The third contact portion GC3 extends through the sixth insulating film 65 from the first electrode 20 (referring to FIG. 1) and is connected to the third control electrode 60. The third contact portion GC3 is, for example, a portion of the first electrode 20 extending through a contact hole provided in the sixth insulating film 65.

Figure 7:
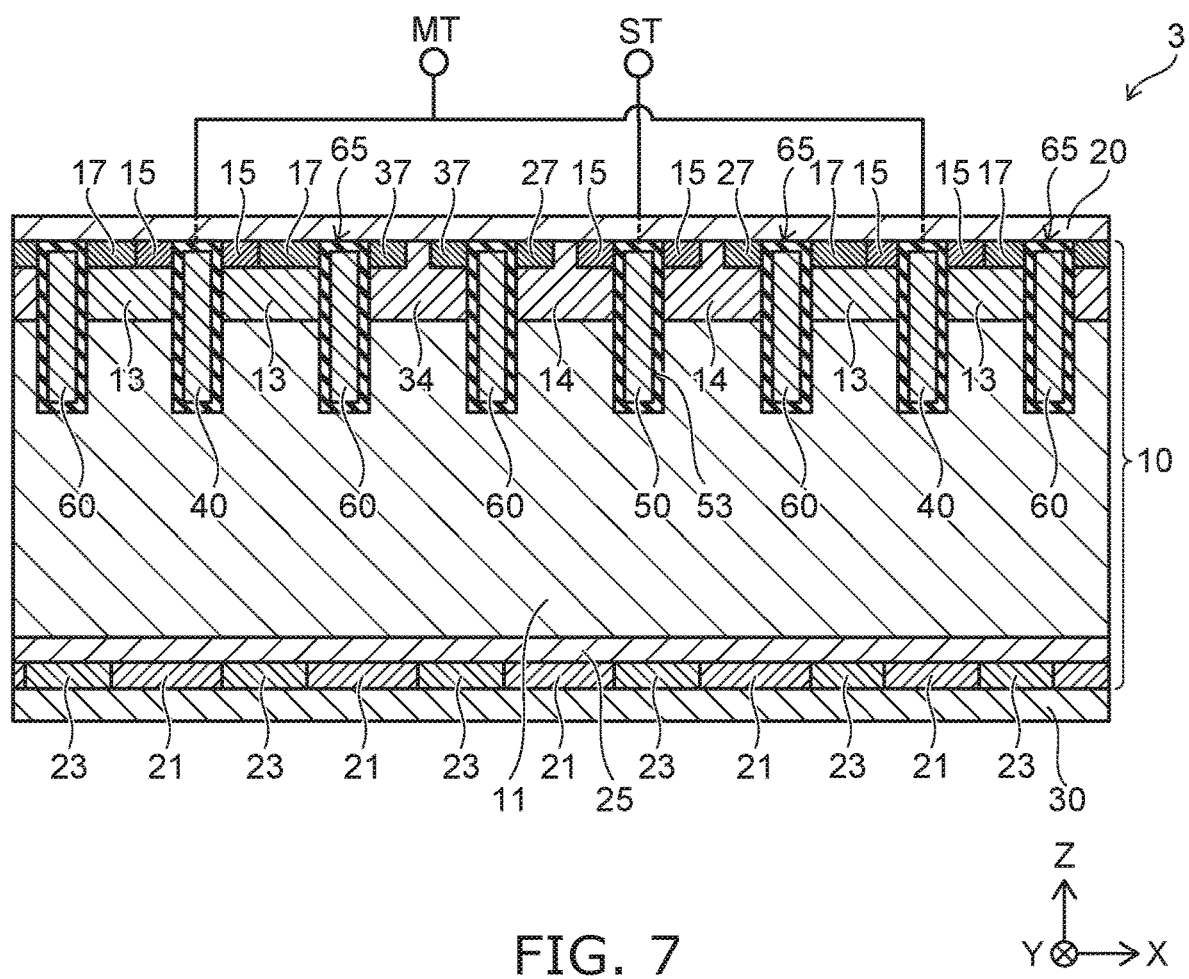
FIG. 7 is a schematic cross-sectional view showing a semiconductor device according to a second modification of the embodiment.

FIG. 7 is a schematic cross-sectional view showing a semiconductor device 3 according to a second modification of the embodiment. In the semiconductor device 3 as shown in FIG. 7, the fourth semiconductor layer 15 is disposed at a position contacting the first insulating film 43 between the second semiconductor layer 13 and the first electrode 20 (referring to FIG. 1) and is disposed at a position contacting the second insulating film 53 between the third semiconductor layer 14 and the first electrode 20. In other words, the second control electrode 50 has the same gate structure as the first control electrode 40.

In the semiconductor device 3, the first control electrode 40 is electrically connected to the first control terminal MT, and the second control electrode 50 is electrically connected to the second control terminal ST. In other words, the potential of the second control electrode 50 can be controlled independently of the potential of the first control electrode 40. Accordingly, even when the p-type impurity concentration in the third semiconductor layer 14 is set to be greater than the p-type impurity concentration of the second semiconductor layer 13, it is possible to induce an n-type inversion layer at the interface between the third semiconductor layer 14 and the second insulating film 53 by applying a higher control voltage to the second control electrode 50 than to the first control electrode 40.

In other words, by inducing the n-type inversion layer at the interface between the second semiconductor layer 13 and the first insulating film 43 of the first control electrode 40 and by inducing the n-type inversion layer at the interface between the third semiconductor layer 14 and the second insulating film 53, the electrons can be efficiently ejected from the first semiconductor layer 11 to the first electrode 20 via the n-type inversion layers and the fourth semiconductor layers 15, and the densities of the holes and the electrons can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a semiconductor part including a first surface and a second surface, the second surface being at a side opposite to the first surface;
   a first electrode provided on the first surface of the semiconductor part;
   a second electrode provided on the second surface of the semiconductor part;
   a first control electrode provided between the semiconductor part and the first electrode, the first control electrode being positioned in a first trench provided at the first surface side of the semiconductor part, the first control electrode being electrically insulated from the semiconductor part by a first insulating film;
   a second control electrode provided between the semiconductor part and the first electrode, the second control electrode being positioned in a second trench provided at the first surface side of the semiconductor part, the second control electrode being electrically insulated from the semiconductor part by a second insulating film; and
   a third control electrode provided between the semiconductor part and the first electrode, the third control electrode being positioned in a third trench provided at the first surface side of the semiconductor part, the third control electrode being electrically insulated from the semiconductor part by a third insulating film and electrically isolated from the first and second control electrodes,
   the semiconductor part including a first semiconductor layer of a first conductivity type, a second semiconductor layer of a second conductivity type, a third semiconductor layer of the second conductivity type, a fourth semiconductor layer of the first conductivity type, a fifth semiconductor layer of the second conductivity type, and a sixth semiconductor layer of the first conductivity type,
   the second semiconductor layer being selectively provided between the first semiconductor layer and the first electrode, the second semiconductor layer including a portion facing the first control electrode via the first insulating film,
   the third semiconductor layer being selectively provided between the first semiconductor layer and the first electrode, the third semiconductor layer including a second-conductivity-type impurity with a higher concentration than a concentration of a second-conductivity-type impurity in the second semiconductor layer, the third semiconductor layer including a portion facing the second control electrode via the second insulating film, the third semiconductor layer including a portion facing the third control electrode via the third insulating film,
   the fourth semiconductor layer being selectively provided between the second semiconductor layer and the first electrode, the fourth semiconductor layer contacting the first insulating film,
   the fifth semiconductor layer being selectively provided between the first semiconductor layer and the second electrode,
   the sixth semiconductor layer being selectively provided between the first semiconductor layer and the second electrode, the sixth semiconductor layer including a first-conductivity-type impurity with a higher concentration than a concentration of a first-conductivity-type impurity in the first semiconductor layer,
   the fifth semiconductor layer and the sixth semiconductor layer being alternately arranged along the second electrode,
   the first electrode being electrically insulated from the first control electrode by a fourth insulating film, and electrically insulated from the second control electrode by a fifth insulating film, the first electrode being electrically connected to the second, third, and fourth semiconductor layers,
   the second electrode being electrically connected to the fifth and sixth semiconductor layers.

2. The device according to claim 1, wherein
   the third control electrode is adjacent to the first control electrode, and
   the second semiconductor layer is provided between the first control electrode and the third control electrode, the second semiconductor layer facing the third control electrode via the third insulating film.

3. The device according to claim 2, wherein
   the semiconductor part further includes a seventh semiconductor layer of the second conductivity type,
   the seventh semiconductor layer is selectively provided between the second semiconductor layer and the first electrode, the seventh semiconductor layer including a second-conductivity-type impurity with a higher concentration than a concentration of the second-conductivity-type impurity in the third semiconductor layer, and
   the fourth semiconductor layer and the seventh semiconductor layer are arranged along the first electrode.

4. The device according to claim 3, wherein
   the seventh semiconductor layer contacts the third insulating film.

5. The device according to claim 1, wherein
   the semiconductor part further includes an eighth semiconductor layer of the first conductivity type,
   the eighth semiconductor layer is provided between the first semiconductor layer and the fifth semiconductor layer, the eighth semiconductor layer including a first-conductivity-type impurity with a higher concentration than a concentration of the first-conductivity-type impurity in the first semiconductor layer.

6. The device according to claim 5, wherein
   the eighth semiconductor layer extends between the first semiconductor layer and the sixth semiconductor layer.

7. The device according to claim 1, wherein
   the semiconductor part further includes a ninth semiconductor layer of the second conductivity type, and
   the ninth semiconductor layer is selectively provided between the third semiconductor layer and the first electrode, the ninth semiconductor layer including a second-conductivity-type impurity with a higher concentration than the concentration of the second-conductivity-type impurity in the third semiconductor layer.

8. The device according to claim 7, wherein
the ninth semiconductor layer contacts the first insulating film and is electrically connected to the first electrode.

9. The device according to claim 7, wherein
a plurality of the ninth semiconductor layers is provided,
one of the ninth semiconductor layers contacts the second insulating film, and
another one of the ninth semiconductor layers contacts the third insulating film.

10. The device according to claim 1, wherein
a plurality of the third control electrodes is provided,
the semiconductor part further includes a tenth semiconductor layer of the second conductivity type, and
the tenth semiconductor layer is provided between two adjacent third control electrodes of the plurality of third control electrodes, the tenth semiconductor facing each of the two adjacent third control electrodes via a third insulating film, the tenth semiconductor including a second-conductivity-type impurity with a higher concentration than the concentration of the second-conductivity-type impurity in the second semiconductor layer.

11. The device according to claim 10, wherein
the semiconductor part further includes an eleventh semiconductor layer of the second conductivity type, and
the eleventh semiconductor layer is selectively provided between the tenth semiconductor layer and the first electrode, the eleventh semiconductor layer including a second-conductivity-type impurity with a higher concentration than the concentration of the second-conductivity-type impurity in the tenth semiconductor layer.

12. The device according to claim 11, wherein
the eleventh semiconductor layer faces one of the two adjacent third control electrodes via the third insulating film.

13. The device according to claim 10, wherein
one of the third control electrodes is adjacent to the first control electrode, and
the second semiconductor layer is provided between the first control electrode and the one of the third control electrodes, the second semiconductor layer facing the one of the third control electrodes via the third insulating film.

14. The device according to claim 1, wherein
a plurality of the fourth semiconductor layers is provided, and
one of the fourth semiconductor layers is selectively provided between the third semiconductor layer and the first electrode, one of the fourth semiconductor layers contacting the second insulating film.

15. The device according to claim 1, wherein
the second control electrode is electrically connected to the first control electrode.

16. The device according to claim 15, further comprising:
a first control terminal provided on the first surface of the semiconductor part, the first control terminal being separated from the first electrode,
the first control electrode and the second control electrode being electrically connected to the first control terminal.

17. The device according to claim 1, wherein
the third control electrode is electrically connected to the first electrode.

18. The device according to claim 17, wherein
the first electrode is provided on the third control electrode with a sixth insulating film interposed, and
the first electrode is electrically connected to the third control electrode via a contact hole provided in the sixth insulating film.

19. The device according to claim 1, further comprising:
a first control terminal provided on the first surface of the semiconductor part, the first control terminal being separated from the first electrode; and
a second control terminal provided on the first surface of the semiconductor part, the second control terminal being separated from the first electrode and the first control terminal,
the first control electrode being electrically connected to the first control terminal,
the second control electrode being electrically connected to the second control terminal.

20. The device according to claim 19, further comprising:
a first control interconnect extending from the first control terminal; and
a second control interconnect extending from the second control terminal,
the first control electrode being electrically connected to the first control terminal via the first control interconnect,
the second control electrode being electrically connected to the second control terminal via the second control interconnect.

* * * * *